US006819578B2

(12) United States Patent
Regev (10) Patent No.: US 6,819,578 B2
(45) Date of Patent: Nov. 16, 2004

(54) REDUCED SIGNAL SWING IN BIT LINES IN A CAM

(75) Inventor: Zvi Regev, West Hills, CA (US)

(73) Assignee: Micron Technology, Inc., Boise, ID (US)

( * ) Notice: Subject to any disclaimer, the term of this patent is extended or adjusted under 35 U.S.C. 154(b) by 154 days.

(21) Appl. No.: 10/200,775

(22) Filed: Jul. 24, 2002

(65) Prior Publication Data

US 2003/0058674 A1 Mar. 27, 2003

Related U.S. Application Data (60) Provisional application No. 60/324,459, filed on Sep. 25, 2001.

(51) Int. Cl.[7] .............................................. G11C 15/00
(52) U.S. Cl. .................................... 365/49; 365/189.05
(58) Field of Search .............................. 365/49, 189.05

(56) References Cited

U.S. PATENT DOCUMENTS

| 4,761,767 | A | * | 8/1988 | Ferrant ........................ 365/200 |
| 4,943,945 | A | * | 7/1990 | Lai ........................ 365/189.09 |
| 5,257,232 | A | * | 10/1993 | Dhong et al. ................ 365/203 |
| 6,678,196 | B2 | * | 1/2004 | Regev ........................ 365/205 |

OTHER PUBLICATIONS

Nicky Chau–Chun Lu, "Half Voo Bit–Line Sensing Scheme in CMOS DRAM's," IEEE Journal of Solid–State Circuits, vol. SC–19, No. 4, Aug. 1987.

Seung–Moon Yoo, et al., "A 256M DRAM with Simplified Register Control for Low Power Self Refresh and Rapid Burn–In," 1994 Symposium on VLSI Circuits Digest of Technical Papers, pp. 85–86.

Masaki Tsukude, et al., "Automatic Voltage–swing Reduction (AVR) Scheme for Ultra Low Power DRAMs," 1994 Symposium on VLSI Circuits Digest of Technical Papers, pp. 87–88.

T. Inaba, et al., "A 250mV Bit–Line Swing Scheme for a 1V 4Gb DRAM," 1995 Symposium on VLSI Circuits Digest of Technical Papers, pp. 99–100.

* cited by examiner

*Primary Examiner*—David Nelms
*Assistant Examiner*—Tu-Tu Ho
(74) *Attorney, Agent, or Firm*—Dickstein Shapiro Morin & Oshinsky LLP (57) ABSTRACT

A Content Addressable Memory device with a bit line that is driven between first and second voltage levels depending on the state of a logic signal applied thereto. The magnitude of the voltage swing between the first and second voltage levels is reduced in comparison to other voltages of the Content Addressable Memory device, or in comparison to the voltage swing of prior art bit lines, so that effects associated with power dissipation by the bit line are reduced. The memory includes a plurality of match lines and a plurality of bit lines, each of the plurality of bit lines coupled to a bit line driver circuit adapted to provide a bit line voltage with reduced signal swing.

12 Claims, 9 Drawing Sheets

REDUCED SIGNAL SWING IN BIT LINES IN A CAM

CROSS-REFERENCE TO RELATED APPLICATIONS

The present application claims the benefit of U.S. Provisional Patent Application No. 60/324,459, filed on Sep. 25, 2001, the disclosure of which is herewith incorporated by reference in its entirety.

BACKGROUND OF THE INVENTION

A content addressable memory (CAM) is a memory device that permits rapid parallel searching of stored data to find a particular data value. In contrast to most other memory formats (such as ROM and RAM memory), which are based on address-driven storage architectures, the typical CAM memory device offers both address-driven and content-driven data access.

Address-driven memory device architectures are well-known. According to an address-driven architecture, during a memory access, a user supplies an address and stores or retrieves data stored at that specific address. For example, in an address-driven data handling scheme, data values may be stored at a particular logical address by specifying the address on an address bus, and supplying data on a data bus to be stored at the specified address. This is the storage mechanism typically found in RAM memory. In the same fashion, data may be retrieved on the data bus in response to a memory address supplied on the address bus.

As noted, the typical CAM memory device can be accessed in both address-driven and content-driven fashion. Storage of data in a CAM may be performed in an address-driven mode, as described above. Additionally, some CAM memory devices allow storage of data in a "first available storage location." For example a logical flag may be provided for each memory cell of the CAM device, indicating whether a cell contains stored data, or is available to receive new data. When a new data item is presented to the CAM device, each logical flag of the logical flag set is tested simultaneously and an unused storage location is identified. The new data item is then stored in the unused storage location, and the logical flag associated with that location is reconfigured to indicate that the location is in use.

As with data storage, data retrieval in a CAM memory may be performed on an address-driven basis. More importantly, however, CAM memory provides content-driven data retrieval. In a content-driven data search system, a data pattern is presented to the CAM memory device. If the CAM memory device contains a previously stored data item of the same data pattern, that presence is indicated and the location in the CAM where the searched data is stored is returned. The CAM memory device is structured to perform the search on a highly parallel basis, conducting the search on all the data in the CAM simultaneously. Consequently, a CAM can provide search results much more rapidly than an address-driven memory device, in which searches are typically performed serially, one address at a time.

The content-driven data retrieval facility described above makes CAM memory useful in the design of database management, pattern recognition, list management, and telecommunications hardware. CAM is particularly valuable in image and voice recognition systems and in network switching equipment such as, for example, network routers in which CAM memory is used to convert between various address formats. Any technology that requires rapid content searching for an arbitrary data pattern may benefit from the application of CAM technology.

The content-driven data retrieval facility of a CAM memory is typically implemented by providing an array of storage cells connected in an extensive wired-or configuration. This architecture allows a multi-bit data word applied to an input of the CAM device to be compared, virtually simultaneously, with the data words stored in every location of the CAM.

Figure 1:
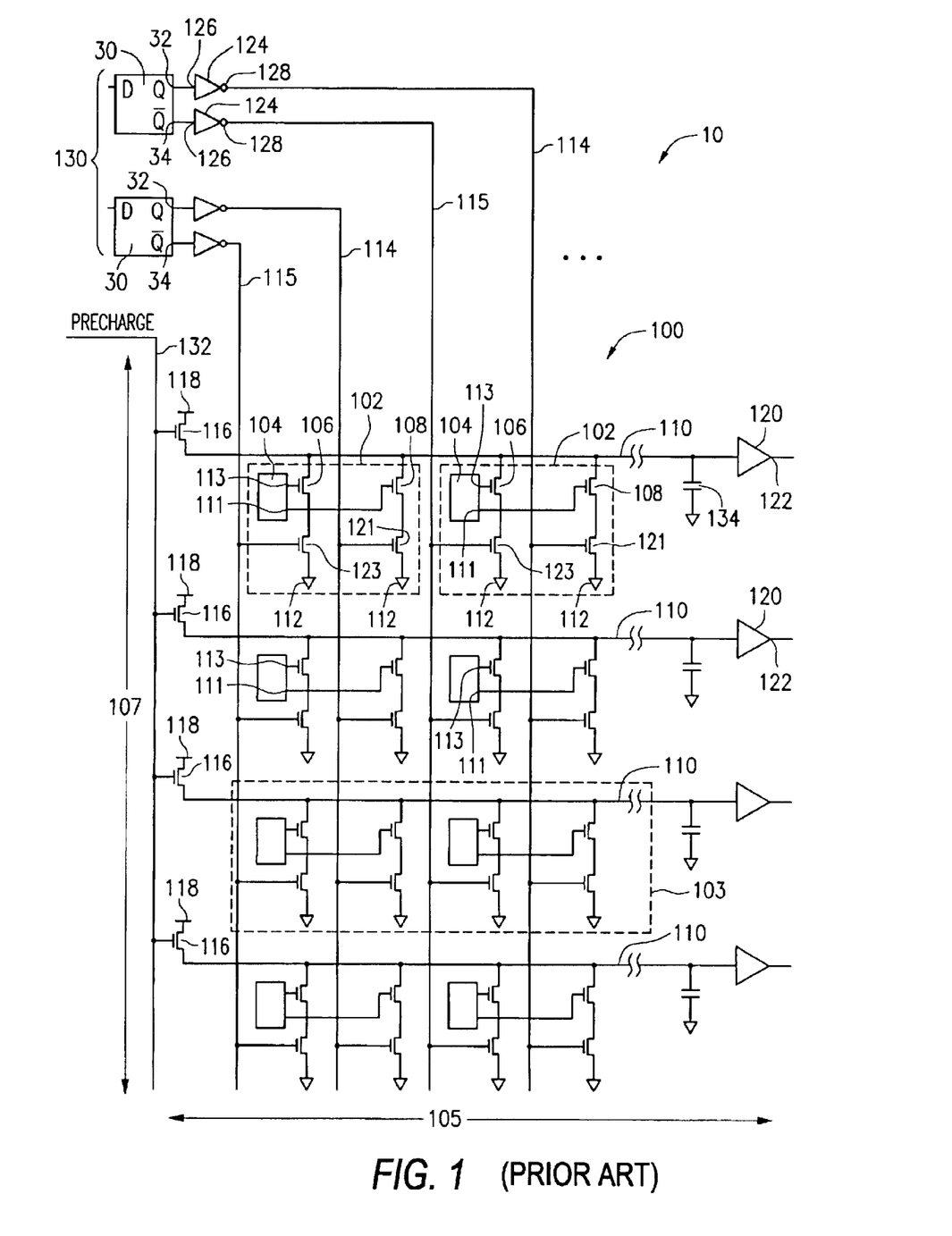
FIG. 1 shows a simplified representation of a conventional content addressable memory device in block diagram form.

FIG. 1 shows a simplified schematic representation of a CAM memory device, as known in the art. The CAM device 10 includes an array 100 of CAM memory cells 102 coupled in a first direction by complemented 114 and un-complemented 115 bit lines and in a second direction by match lines 110. The complemented bit lines 114 and un-complemented bit lines 115 are respectively coupled to un-complemented 34 and complemented 34 outputs of respective bit storage locations 30 of an input buffer. Thus, for example, when a "0" is stored in a bit storage location 30, the un-complemented bit lines 115 exhibits a "0" state and the complemented bit line 114 exhibits a "1".

The array is arranged in words 103 of memory cells 102. Each word 103 is a given number of memory cells wide, the width corresponding to a width of the array 105. The array has a depth 107 equal to the number of words 103 of memory cells in the array. Each of the memory cells 102 includes a memory element 104 with an un-complemented output 111 and a complemented output 113.

Memory element 104 may be implemented in any of a wide variety of technologies as known in the art. For example, the memory element may be a static memory element as found in conventional static random access memory (SRAM) or a dynamic memory element as found in conventional dynamic random access memory (DRAM).

The un-complemented output 111 of memory element 104 outputs a signal representing a binary value stored within the memory element. The complemented output 113 outputs a signal representing the inverse of the value stored within the memory element 104.

The memory cell 102 also includes an un-complemented memory element transistor 108, a complemented memory element transistor 106, an un-complemented bit line transistor 123 and a complemented bit line transistor 121. For each memory element, the respective drains of the respective complemented 106 and un-complemented 108 memory element transistors are coupled to a respective match line 110 of the array 100. A source of the complemented memory element transistor 106 is coupled to a drain of the un-complemented bit line transistor 123. A source of the un-complemented memory element transistor 108 is coupled to the drain of the complemented bit line transistor 121. The sources of the complemented 121 and un-complemented 123 bit line transistors are mutually coupled to a source of ground potential 112. A gate of the complemented memory element transistor 106 is operatively coupled to the respective complemented output 113 of the memory element 104, so that the state of the memory element transistors reflect the logical state of the memory element. A gate of the un-complemented memory element transistor 108 is operatively coupled to the respective un-complemented output 111 of the memory element 104. The gates of the complemented bit line transistor 121 and the un-complemented bit line transistor 123 are coupled respectively to the complemented 114 and un-complemented 115 bit lines associated with the respective memory cell 102.

A plurality of precharge transistors 116 serve to switchingly couple each respective match line 110 to a source 118 of precharge potential. The respective gates of precharge transistors 116 are mutually coupled to a source of a precharge signal 132. Each match line 110 is coupled to a respective input of one of a plurality of buffer circuits 120. The buffer circuits 120 serve to amplify an electrical signal on the match line 110 and present an amplified signal at a respective output 122.

Each bit line 114, 115 is driven by a respective inverting driver 124 having an input 126 for receiving a data value and an output 128 coupled to the inverting bit line 114.

The intrinsic capacitance of each match line 110 is represented by capacitor 134 coupled between the bit line 110 and the source of ground potential 112. Together, the respective plurality of inputs D, of the register bit storage locations 30, form a data port 130 for receiving an input data value into the CAM device 10. The data port 130 has a width equal to the width 105 of each data word 103.

In operation, a search cycle of the CAM begins by precharging the match lines. A logical low signal from the precharge signal source causes the plurality of precharge transistors to conduct current from a source of precharge potential 118 onto respective match lines 110, charging the respective capacitance 134 of each match line. Thereafter, the precharge signal is brought high so as to disconnect the match lines 110 from the source of precharge potential 118. Data is then applied to the CAM to perform a content-based data access.

The bit values of a data word are applied at port 130. These bit values are stored in data buffer elements 30 and output in complemented and un-complemented form at outputs 34 and 32 respectively. The bit values are inverted again by the inverting drivers 124 so that the logical complement of the applied data word is present on the inverted bit lines 114. Concurrently non-inverted data values are available on the un-complemented bit lines 115.

Because the CAM memory cells 102 are coupled to the bit lines 110 in wired-or fashion any of the CAM memory cells 102 is capable of grounding, and thus discharging, the respective match line 110 to which is coupled. Any bit applied to an input of port 130 that does not match the bit value stored in the corresponding memory cell 104 causes the respective memory cell transistor and bit line transistor, acting together, to discharge the match line 110 coupled to that memory cell 104.

Figure 2:
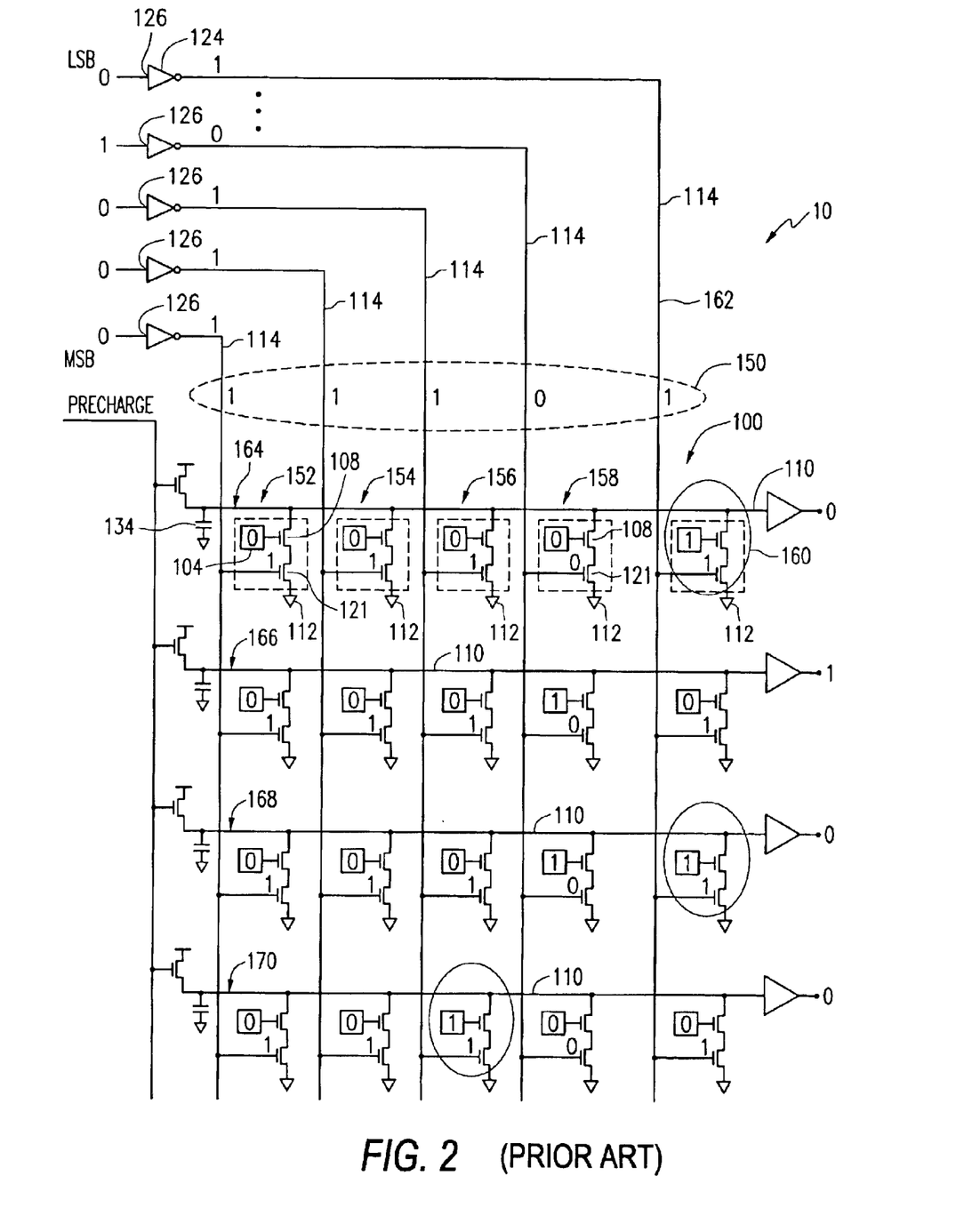
FIG. 2 represents a logical state of a content addressable memory device as shown in FIG. 1.

FIG. 2 graphically shows the operation of a simplified CAM device for an exemplary data word. Note that for clarity of illustration, the un-complemented bit lines 115 have been omitted from FIG. 2. Likewise, the respective un-complemented bit line transistors 123 and complemented memory element transistors 113 have been omitted from each memory cell 102 of FIG. 2. The complemented bit line transistors 121 and un-complemented memory element transistors 108 are shown.

In FIG. 2, one sees that the exemplary CAM device 10 comprises an array of twenty memory cells arranged in four five-bit words. The respective values of the five-bit words applied at the driver inputs 126 are 00001, 00010, 00011 and 00100. After precharging the device to charge the match lines 110, an input data word 00010 is applied at the respective inputs of the inverting line drivers 124. The inverters 124 complement the input data word yielding 11101 on the bit lines 114 as shown at 150.

Each respective digit of this data pattern is applied simultaneously to all the respective gates of the complemented bit line transistors 121 coupled to the respective bit line bearing the digit.

Examining particular memory cells, one sees that particular memory cell 152 includes a storage element 104 storing the value 0 and a bit line 114 bearing the value 1. Accordingly, although the bit line transistor is conductive, the storage element transistor is nonconductive and memory cell 152 does not couple the match line 110 to ground. Likewise, no one of particular memory cells 154, 156, and 158 provides a conductive path from the particular match line 164 to ground 112.

Memory cell 160, however, stores a value of 1 in its respective memory element. This value, in conjunction with the 1 value present on the particular bit line 162 coupled to memory cell 160 causes the memory cell 160 to ground the particular match line 164 and discharge the respective capacitance 134 of that match line. Thus, since the data word (00001) stored in the memory cells associated with the particular match line 164 does not equal the data value (00010) applied at the respective inputs of the inverting line drivers 124, the match line 164 transitions to a low state as quickly as the capacitance 134 of the bit line 110 can be discharged. In similar fashion, the data values associated with match lines 168 and 170 do not match the data word applied at the respective inputs of the inverting line drivers 124, and match lines 168 and 170 also rapidly discharge to ground potential.

The result for the particular match line 166 is different, however. The data values (00010) stored in the memory elements associated with the particular match line 166 are identical to those of the data word (00010) applied at the respective inputs of the inverting line drivers 124. When the complement of the applied data word (11101) is applied to the respective bit-line transistor gates of the memory cells coupled to particular match line 166, no path to ground is activated. Accordingly, the capacitance of particular match line 166 is not discharged, and match line 166 retains a voltage substantially equal to that supplied by the precharge voltage source 132. This precharge voltage on match line 166 indicates the match that exists between the data of match line 166 and the applied data word. Subsequently, the presence of this match may be output as a binary state, and/or the match indication may be used to output a further data value logically coupled to the matched data value, such as the storage address of the matching data word.

It is readily apparent that the un-complemented bit line transistors and complemented memory element transistors omitted from FIG. 2 would yield additional paths to ground for match lines associated with stored data words that do not match the data input to the CAM. For example, the complemented bit line transistor 121 and un-complemented memory element transistor 108 of the particular memory cell 158, as shown, do not ground the particular match line 164. Their complements, (i.e., the un-complemented bit line transistor and the complemented memory element transistor), however, would ground the particular match line 164 because the input bit has a value 1 and the stored bit has a value 0.

In the above-described search process, the searched data (i.e., the input bits) is simultaneously compared with every data word in the CAM in order to find a match between the stored data and the input data. Since the comparison operation is conducted simultaneously on the entire memory, and is typically repeated at a very high frequency, this operation consumes a significant amount of power. Accordingly, it is desirable to find a way to reduce power dissipation of CAM match detection circuits while maintaining the same levels of accuracy.

As known in the art, CAM arrays are typically much larger than the exemplary arrays illustrated in FIGS. 1 and 2. Without limiting the invention in any way, it is observed that CAM devices are known or contemplated with word widths of about 32 to about 320 bits wide. Such devices may readily include 64K words of memory cells. An exemplary CAM has a depth of approximately 64K 144 bit words. Thus each bit line is coupled to approximately 65 thousand bit line transistor gates. Consequently, the bit line will exhibit a capacitance resulting from at least the intrinsic capacitance of the bit line conductor and the capacitances of the 64K bit line transistor gates. This capacitance presents an appreciable load on the bit-line drivers 124 of the CAM. Moreover, because substantial current is required to charge the bit line capacitance, the resistance of the driver components, bit lines and gates subject to this current results in the dissipation in the CAM device of a correspondingly large amount of non-reactive power.

Power dissipation, P, in a circuit such as that depicted in FIG. 1, is related to the magnitude of signal swing, V, the load capacitance C, and the frequency of operation F ($P=C*F*V^2$). In particular, power dissipation from a CAM device can be represented as ($P=C*F*VDD*Vout$) where Vout is the magnitude of the voltage swing during a bit line transition. As noted above, the CAM device is searched in parallel fashion. Consequently, during a search cycle every bit line of the device, and all of the transistor gates coupled to those bit lines, experience the entire voltage swing Vout of the bit line. Signal swing for conventional CAM device bit lines is from VDD to ground, and power is dissipated by the circuit accordingly. The power dissipated in the bit lines of a CAM can amount to approximately 40% of the power budget of a CAM device.

Device speed can be improved by dividing each bit line into segments, with repeating drivers coupling one segment to the next. While this reduces the load on the drivers 124, it costs additional chip real estate, and does nothing to reduce the overall capacitance and net power dissipation of the device.

BRIEF SUMMARY OF THE INVENTION

A device prepared according to the present invention includes a CAM exhibiting reduced power dissipation and improved thermal characteristics and a method for operating the same. According to one aspect of the invention, a CAM device includes a bit line driver with reduced output voltage swing. Binary logic circuit devices typically operate between logic states defined such that one state of the device is at one extreme of a power supply output (e.g., ground), and another state of the logic device is at the other power supply extreme (e.g., VDD), with a nominal logic threshold at ½ VDD. However, a reduced voltage applied to the bit lines will activate the wired or transistors of the CAM memory cells while the bit lines dissipate less power than if a full voltage swing were applied. Thus, according to one aspect of the invention, reduced bit line voltage swing is achieved by limiting an upper extreme of voltage swing by a configuration of the bit line driver circuit. According to a further aspect of the invention, reduced bit line voltage swing is achieved by supplying a reduced supply voltage to a bit line driver of the CAM with a reduced voltage power supply. In one aspect of the invention, the reduced voltage power supply is a discrete power supply implemented separately from the CAM integrated circuit. In another aspect of the invention, the reduced voltage power supply is a power supply mutually integrated with a CAM device on a single integrated circuit substrate member. In a still further aspect of the invention, the reduced voltage power supply is a charge pump voltage supply circuit adapted to receive a low voltage supply voltage received by the integrated circuit, and adapted to convert the low received voltage to an elevated voltage that is nonetheless reduced with respect to the corresponding bit line voltages of prior art CAM devices, or with respect to other voltages present on the CAM integrated circuit.

BRIEF DESCRIPTION OF THE DRAWINGS

The above and other features and advantages of the invention will be more readily understood from the following detailed description of the invention which is provided in connection with the accompanying drawings.

DETAILED DESCRIPTION OF THE INVENTION

Figure 3:
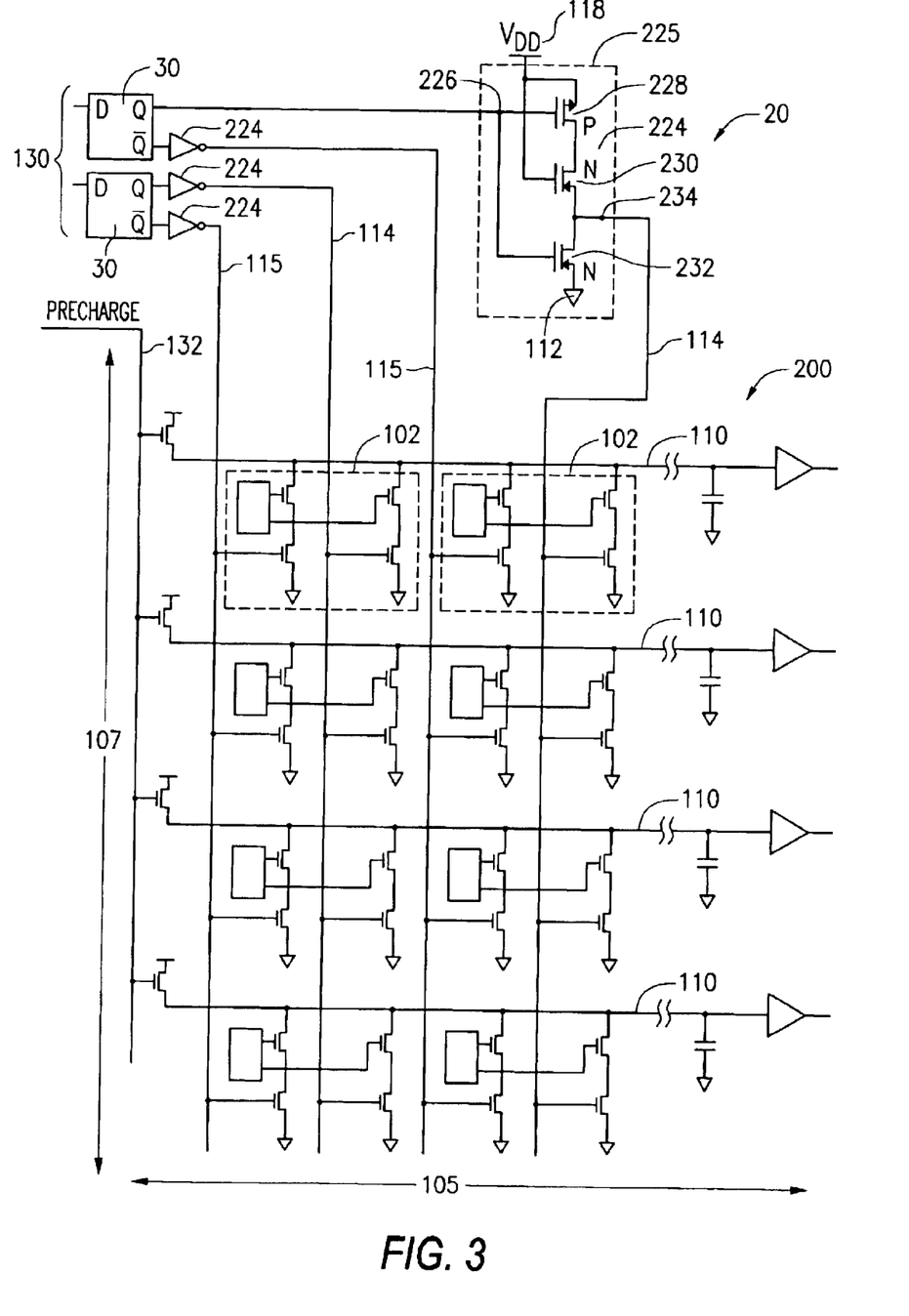
FIG. 3 shows a content addressable memory having reduced bit line voltage swing according to one aspect of the invention.

FIG. 3 shows a CAM memory device 20 according to one aspect of the invention. The CAM device 20 includes a plurality of CAM memory cells 102. In one embodiment of the invention, the memory cells 102 are arranged in an array 200 and coupled to respective match lines 110 and bit lines 114, 115 in a manner following the arrangement of the prior art device of FIG. 1. Inasmuch as this arrangement has been described above, the conventional portions of the array will not be described again here.

Unlike the prior art device described above, however, the present invention includes bit line drivers 224 adapted to provide reduced voltage swing on bit lines 114, 115 during operation of the CAM memory device. According to one aspect of the invention, the reduced voltage swirl on bit lines 114, 115 is between about 0 V and about 0.9 V. Each bit line driver includes a respective input 226. The inputs 226 of the bit line drivers, are coupled through respective input buffer cells 30 to the input port 130 of the CAM device.

According to one aspect of the invention, FIG. 3 schematically shows the internal circuitry of a particular one 225 of the bit line drivers 224. The inverting driver 224 includes a first p-type transistor 228 and second 230 and third 232 n-type transistors.

The source of the first p-type transistor 228 is coupled to a source of constant electrical potential (Vdd) 118. The drain of p-type transistor 228 is coupled to the drain of the second n-type transistor 230, and the gate of p-type transistor 228 is coupled to the input node 226 of the inverter. The source of the second n-type transistor 230 is coupled to the drain of the third n-type transistor 232, and the source of the n-type transistor 232 is coupled to a source of ground potential 112. The gate of n-type transistor 230 is coupled to Vdd 118, and the gate of n-type transistor 232 is coupled to the input node 226 of the inverter.

Figure 4:
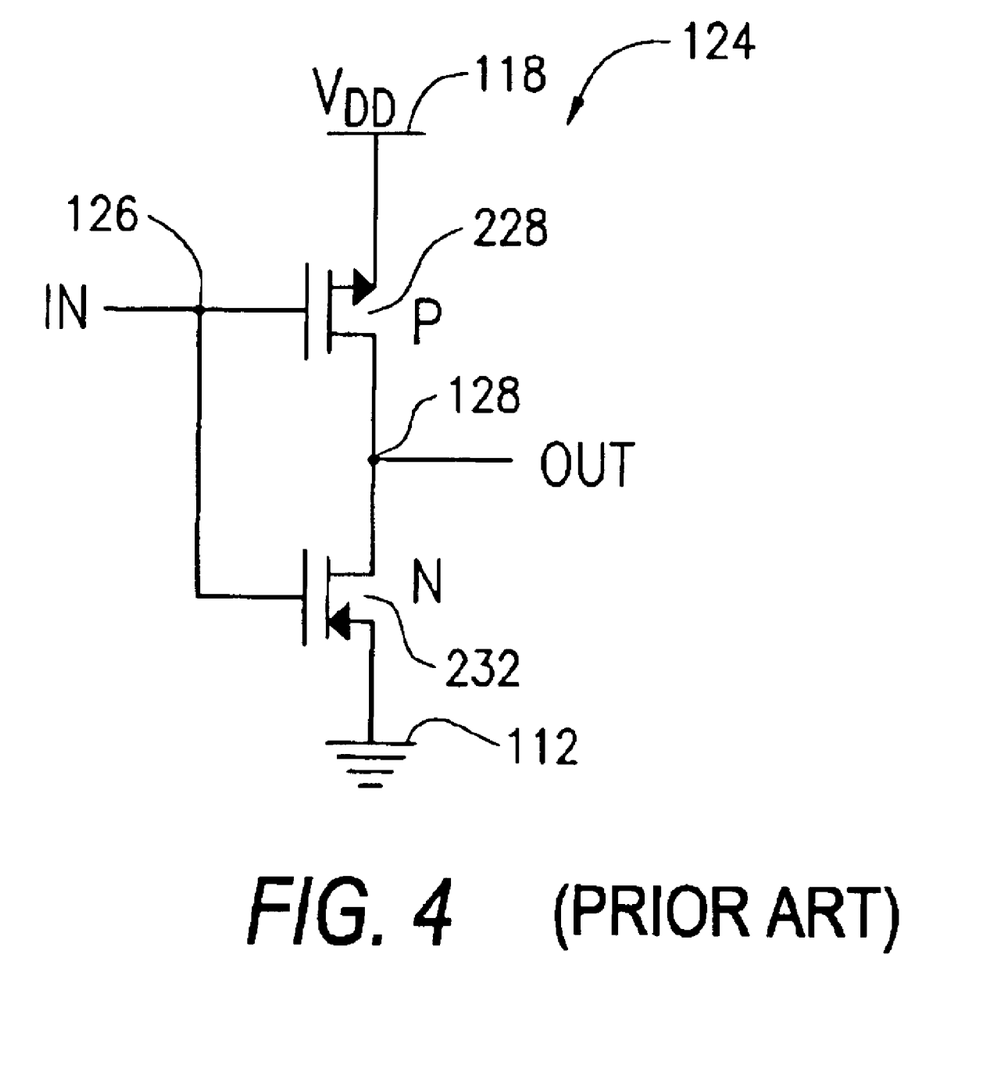
FIG. 4 shows a conventional inverter circuit in schematic diagram form.

The circuit structure of the FIG. 3 inverter 225 may be contrasted with the circuit structure of a prior art inverter, as illustrated in FIG. 4. The prior art inverter 124 includes a p-type transistor 228 and an n-type transistor 232. The p-type transistor of the inverter 124 has a source coupled to Vdd 118, and a drain connected directly to the drain of the n-type transistor 232. The source of the n-type transistor is coupled to ground 112. The respective gates of the p-type 228 and n-type 232 transistors are mutually coupled to the input 126 of the conventional inverter 124.

In the FIG. 4 circuit, when the inverter input 126 receives a "1" signal, the n-type transistor 232 enters a conductive state, and the p-type transistor 228 turns off. Consequently, the output 128 of the inverter 124 is held near or substantially at ground potential 112. When the prior art inverter 124 receives a "0" input signal, transistor 232 becomes non-conductive, transistor 228 conducts, and the output 128 of the inverter 124 rises to a voltage near or substantially at Vdd 118.

In the FIG. 3 circuit, when the inverter input 226 receives a "1" signal, the n-type transistor 232 enters a conductive state, and the p-type transistor 228 turns off. Consequently, the output 234 of the inverter 224 is held near or substantially at ground potential 112. However, when the FIG. 3 inverter 224 receives a "0" input signal, transistor 232 becomes non-conductive, and transistor 228 conducts. Transistor 230 also begins to conduct until the voltage at the output node 234 rises to within one threshold voltage drop of VDD. Thereafter, transistor 230 turns off (becomes nonconductive). Consequently, the output 234 of the inverter 224 rises only to a voltage near or substantially equal to (Vdd−Vth) where Vth is the threshold voltage of the second n-type transistor 230. This lower "on" voltage of the inverter 224 of the invention results in a smaller signal swing on the respective bit line 114 coupled to the inverter 224 than is present on a bit line coupled to a prior art inverter 124. As discussed above, power dissipated by the bit lines drops in relation to this reduction in signal swing.

Figure 5A:
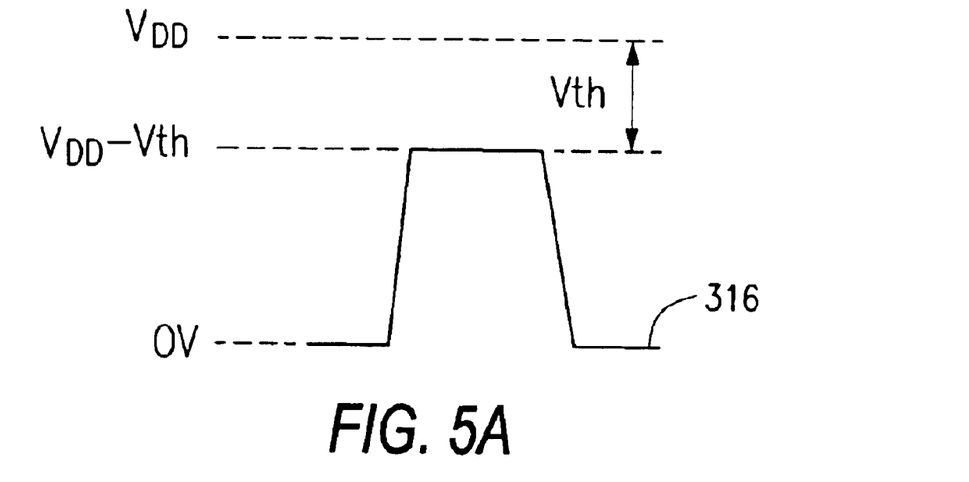
FIG. 5A shows a graphical representation of a bit line voltage signal according to one aspect of the invention.
Figure 5B:
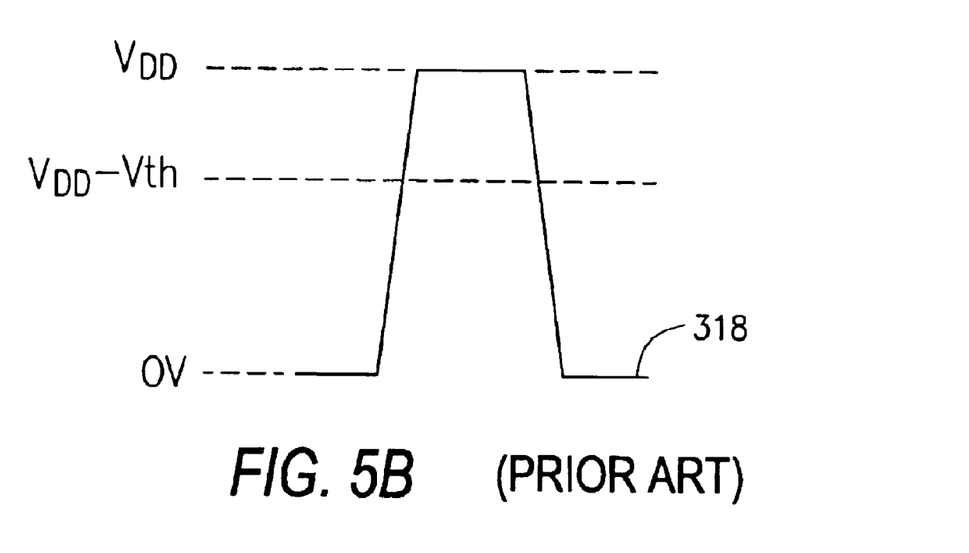
FIG. 5B shows a graphical representation of a bit line voltage signal for a conventional content addressable memory device.

FIGS. 5A and 5B show the output voltage signals corresponding to a transition from a 1 input to a 0 input and back to a 1 input for the inverter of the invention 224, and the prior art inverter 124, respectively. As shown in FIG. 5A, the voltage 316 at the output 234 of the new inverter 224 ranges between 0V and Vdd−Vth, unlike the prior art inverter 124 output, the voltage 318 of which swings from rail to rail.

As discussed above, the illustrated behavior of the FIG. 3 inverter results from the presence of the diode connected transistor 230 in the driver circuit 224. The voltage dropped across transistor 230 is substantially equal to one threshold voltage, which in an exemplary transistor equals approximately 0.7 V. One of skill in the art would understand, however, that by varying transistor doping or other aspects of transistor 230 technology, a wide variety of threshold voltage values is attainable. Moreover, additional values of threshold voltage are anticipated to become available in the future.

Figure 6:
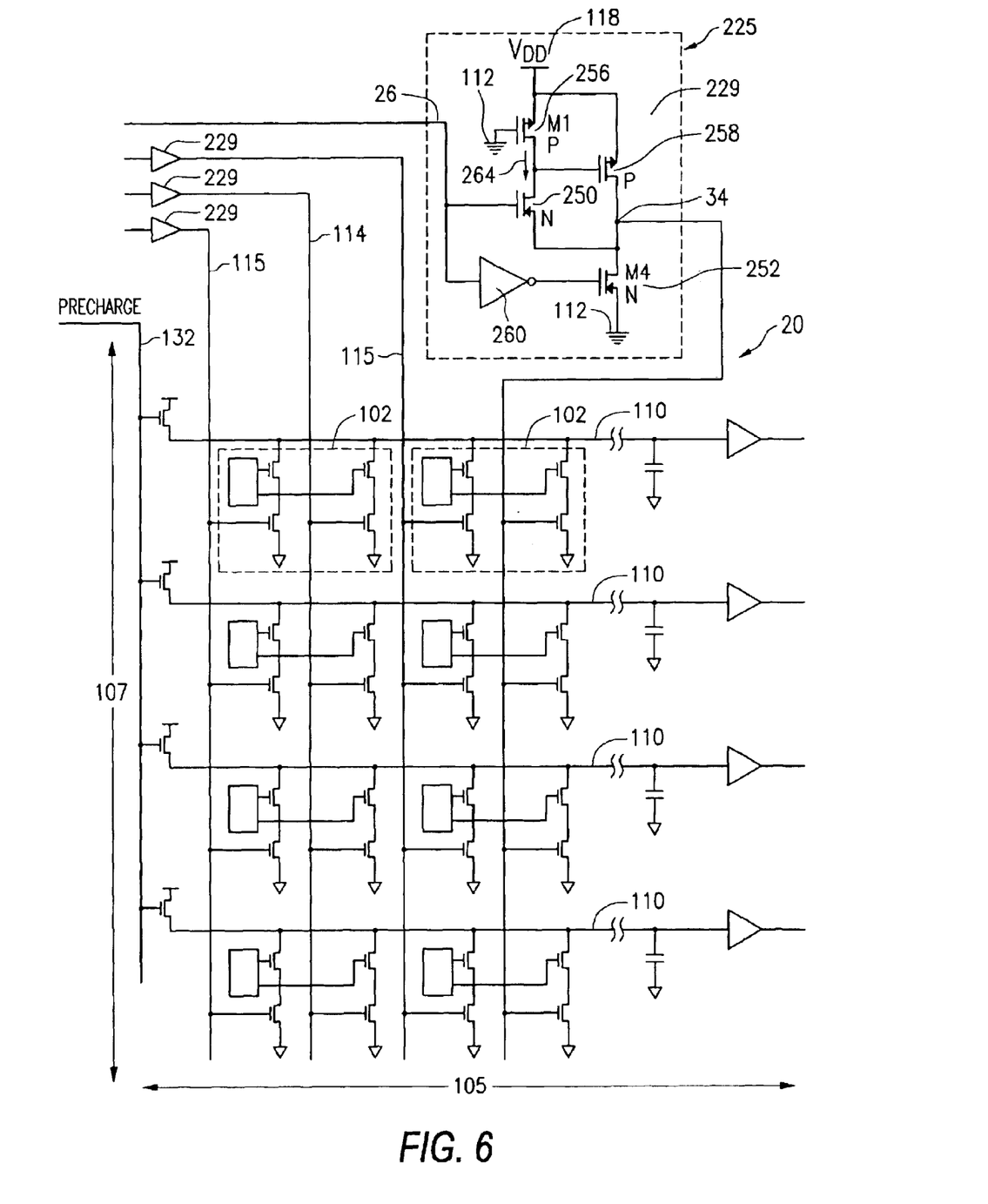
FIG. 6 shows a content addressable memory having an alternative reduced bit line voltage swing driver according to one aspect of the invention.

FIG. 6 shows a CAM memory device according to one aspect of the invention. In FIG. 6, a CAM memory device 20, like that of FIG. 3 is shown but with a non-inverting bit line driver 229 adapted to provide reduced bit line voltage swing. The circuit of the non-inverting bit line driver 229 is shown schematically to include a first n-type transistor 250, a second n-type transistor 252 a third p-type transistor 256 and a fourth p-type transistor 258 as well as an inverter circuit 260. An input node 26 of the driver 229 is coupled to an input of the inverter circuit 260 and a gate of the n-type transistor 250. Transistor 250 has a drain coupled to a drain of transistor 256 and to a gate of transistor 258. A source of transistor 250 is coupled to a drain of transistor 258, a drain of transistor 252, and output node 34 of the driver 229. The sources of transistors 256 and 258 are mutually coupled to a source of supply potential VDD 118. A gate of transistor 256 is coupled to a source of ground potential 112, as is a source of transistor 252. A gate of transistor 252 is coupled to the output of the inverter circuit 260.

As is readily understood by one of skill in the art, the non-inverting driver 229 is adapted to produce a voltage swing between 0V and VDD−Vth as shown by 316 (FIG. 5A). When an input voltage such as VDD is applied to the input 26 of the driver circuit 229, the output of inverter 260 drops to ground potential. This causes transistor 252 to become nonconductive. Simultaneously, the input voltage at node 26 is applied to the gate of transistor 250 causing a current 264 to flow through transistor 250 and simultaneously through transistor 256. The resulting voltage drop across transistor 256 turns on transistor 258. This causes the voltage at output node 34 to rise to a voltage of Vdd−Vth, where Vth is the threshold voltage of transistor 256. When the voltage at node 34 reaches Vdd−Vth, no voltage differential remains between the gate and drain of transistor 258, and transistor 258 turns off. If the voltage at node 34 drops, transistor 258 turns on to restore the node to Vdd−Vth. Thus, the voltage at output node 34 is controlled by the circuit so as to maintain an on-state voltage of Vdd−Vth.

Conversely, a ground-level voltage applied at input node 26 causes inverter 260 to output a high signal (Vdd). This causes transistor 252 to couple output node 34 directly to ground. Accordingly, the voltage swing at output node 34 is between ground and Vdd−Vth.

Figure 7A:
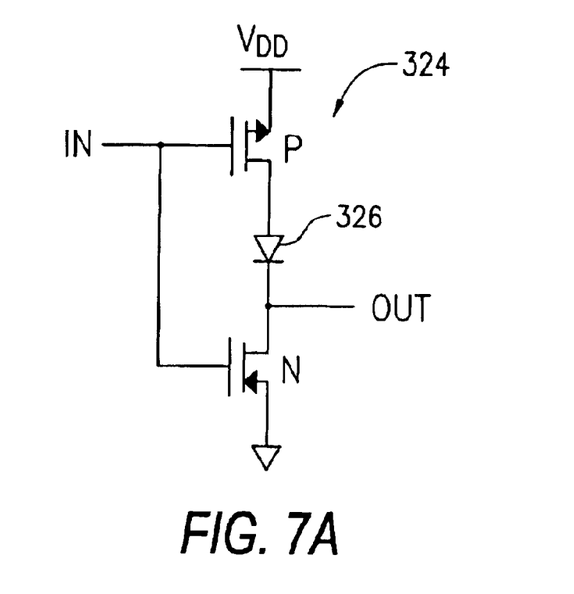
FIGS. 7A and 7B show respective inverting bit line driver circuits according to the invention.
Figure 7B:
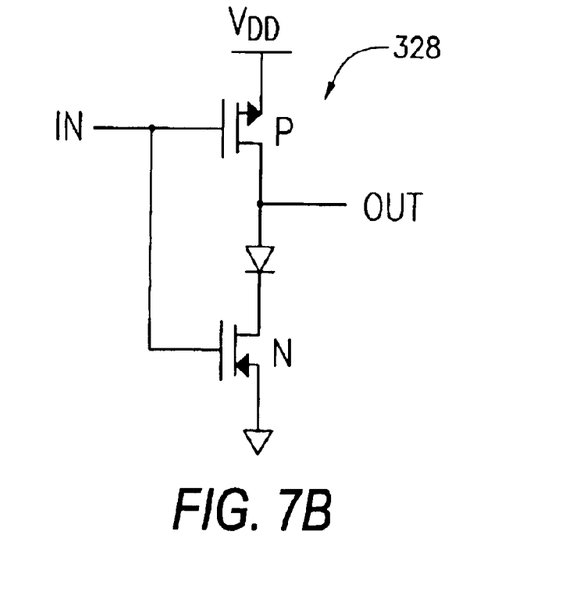

FIGS. 7A and 7B show additional inverter driver circuits exemplary of the invention.

In FIG. 7A, inverter 324 includes a diode 326 used in place of the diode coupled transistor 230 of FIG. 3. Thus the forward voltage drop of the diode 326 (typically from about 0.5 V to about 0.8 V) serves to reduce the signal swing of the inverter 326 output.

FIG. 7B shows that the inverter 328 may be configured to provide an output voltage range that swings between Vdd and a value above ground, rather than between ground and a value below Vdd. As with the above-noted circuit, the inverter circuit 328 of FIG. 7B may be substituted for the inverter circuit 224 of FIG. 3 to produce a CAM device with limited bit line voltage swing.

Figure 8:
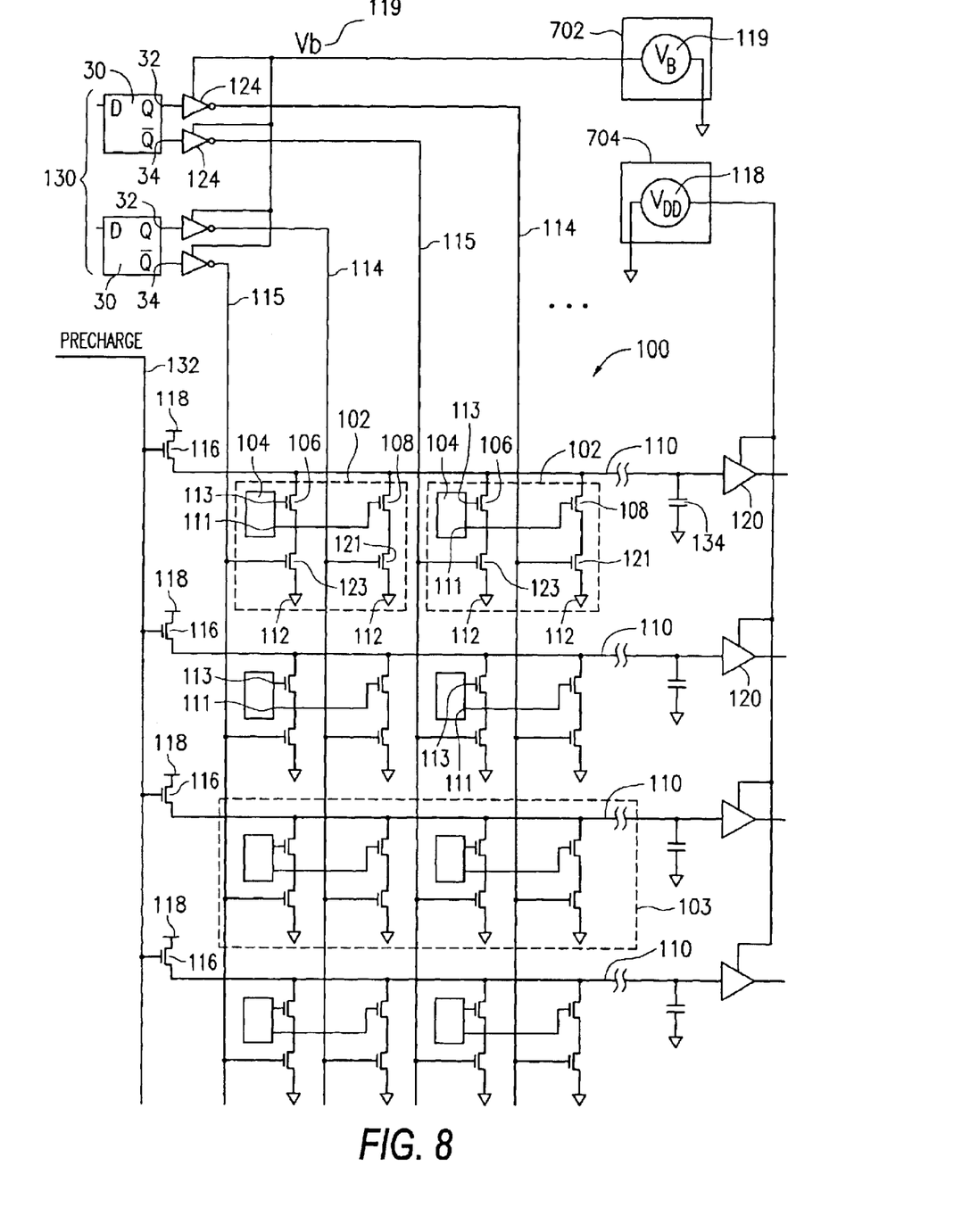
FIG. 8 shows a content addressable memory having a reduced bit line voltage swing according to the invention.

FIG. 8 shows one aspect of the invention including an array of CAM memory cells 200 and a plurality of bit lines 114, 115 driven by inverting drivers 124. The inverters 124 are of substantially conventional design, including respective circuits such as, for example, that of FIG. 4. Instead of being powered with a supply voltage Vdd 118, however, the inverting drivers are supplied with a lower supply voltage Vb 119, (Vb<Vdd). This lower supply voltage Vb 119 is supplied by a power supply 702 adapted to supply this reduced voltage.

In one aspect of the invention, a separate power supply 704 supplies a conventional supply voltage Vdd 118 to other components of the CAM device circuit, such as, for example, match line drivers 120, as shown in FIG. 7.

In a further aspect of the invention, the power supply circuit 702 is a switching power supply adapted to provide supply voltage Vb 119 to the inverting bit line drivers 124. In a different aspect of the invention, the power supply circuit 702 is a charge pump circuit adapted to provide supply voltage Vb 119 to the inverters 124.

In a further aspect of the invention, one or more of standard voltage power supply 704 and reduced voltage power supply 702 are implemented as integrated portions if an integrated circuit sharing a mutual integrated circuit substrate with the CAM device array 200. In another different aspect of the invention, one or more of standard voltage power supply 704 and reduced voltage power supply 702 are implemented as discrete power supplies separate from, though electrically coupled to, the CAM integrated circuit device.

In yet a further aspect of the invention, a single reduced voltage power supply circuit such as 702 is adapted both to supply the bit line drivers 124 of the CAM device, and to supply other power requirements of the CAM, such as the precharge voltage and the match line driver supply voltage. Accordingly, in one aspect of the invention, the entire CAM integrated circuit device operates at a single reduced supply voltage.

Figure 9:
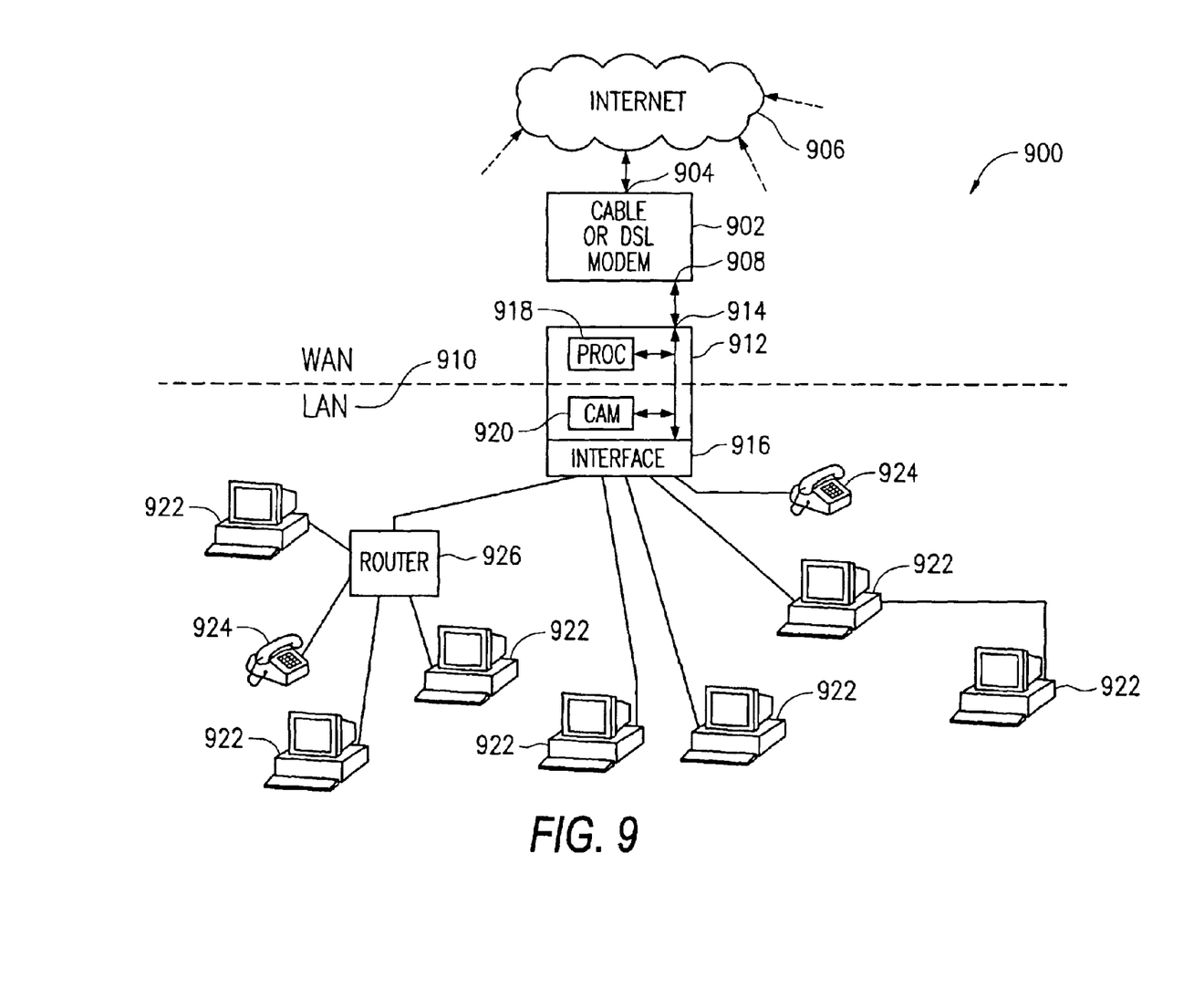
FIG. 9 shows a graphical representation of a network including a router having a content addressable memory with a reduced bit line voltage swing according to the invention.

FIG. 9 shows a communications network 900 according to one aspect of the invention. The network includes a modem 902 having a first port 904 adapted to be coupled to the Internet 906 and a second port 908 adapted to be coupled to a local area network 910. A router 912 has a remote-side port 914 coupled to the second port 908 of the modem, and an interface 916 including a plurality of local ports for connection to local devices. The router 912 includes a processor 918 for receiving and processing information received from and/or destined for the local devices. The router also includes a content addressable memory device 920 having limited bit line voltage swing, as described above. The content addressable memory 920 is coupled to the processor 918 and adapted to store and retrieve data under the control of the processor. A variety of local devices are coupled to respective local ports, of the interface 916, including general-purpose computers 922, telephone devices 924, and network router devices 926.

It is desirable to have a CAM circuit 200 that dissipates less power while maintaining traditionally achieved levels of performance. The present invention accomplishes this by providing a CAM Device 200 that reduces the magnitude of signal swing on a bit line. As illustrated by several exemplary embodiments of the invention, the bit line voltage swings from a predetermined voltage (e.g., ground) to a reduced voltage, where the reduced voltage is at a level lower than Vdd. The reduced voltage swing during operation greatly reduces the power dissipated by each circuit 200.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with specific circuits employing particular configurations of p-type and n-type transistors, the invention may be practiced with many other configurations without departing from the spirit and scope of the invention. Accordingly, the invention is not limited by the foregoing description or drawings, but is only limited by the scope of the appended claims.

What is claimed as new and desired to be protected by Letters Patent of the United States is:

1. A content addressable memory device comprising:
 a first plurality of match lines;
 a second plurality of bit lines;
 a third plurality of memory cells, each memory cell of said third plurality coupled to at least one of said bit lines and to at least one of said match lines; and
 a fourth plurality of match line drivers, each driver of said plurality having an input node and an output node, said respective input node of each driver of said plurality of match line drivers being coupled to a respective one match line of said plurality of match lines, each said output node adapted to output a match line output voltage, said match line output voltage adapted to assume an instantaneous value in a range between a first reference potential and second potential, said match line output voltage taken with respect to said reference potential, each bit line of said plurality of bit lines adapted to assume an instantaneous voltage within a range between said first reference potential and a third potential, said third potential being closer to said reference potential than said second potential.

2. A content addressable memory device comprising:
 a first plurality of memory cells;
 a second plurality of match lines respectively coupled to said first plurality of memory cells;
 a third plurality of un-complemented bit lines respectively coupled to said first plurality of memory cells;
 a fourth plurality of complemented bit lines respectively coupled to said first plurality of memory cells;
 a fifth plurality of bit line drivers respectively coupled to said third plurality of un-complemented bit lines and said fourth plurality of completed bit lines;
 a sixth plurality of match line drivers;
 a seventh plurality of match bit line drivers, each of said match line drivers having a respective output adapted to output an output voltage with an output voltage swing of a first magnitude, each of said bit line drivers having a respective output adapted to output an output voltage having an output voltage swing of a second magnitude, said second magnitude smaller than said first magnitude.

3. A driver circuit for driving a bit line of a content addressable memory, said driver comprising:
 an inverter circuit having a first input and a second output;
 first and second n-type transistors;
 third and fourth p-type transistors; and
 an input node of said driver circuit, said input node being coupled to said first input of said inverter circuit and to a gate of said first n-type transistor, said output node of said inverter circuit being coupled to a gate of said second n-type transistor, a source of said second n-type transistor being coupled to a source of ground potential, a drain of said n-type transistor being coupled to a source of said first n-type transistor and to a drain of said third p-type transistor and to an output node of said, driver circuit, a drain of said first n-type transistor being coupled to a gate of said third p-type transistor and to a drain of said fourth p-type transistor, a gate of said fourth p-type transistor being coupled to a source of ground potential, and respective first and second sources of said third and fourth p-type transistors being mutually coupled to a source of supply potential.

4. A content addressable memory device comprising:

a first plurality of memory cells;

a second plurality of match lines respectively coupled to said first plurality of memory cells;

a third plurality of un-complemented bit lines respectively coupled to said first plurality of memory cells;

a fourth plurality of complemented bit lines respectively coupled to said first plurality of memory cells;

a fifth plurality of bit line drivers respectively coupled to said third plurality of bit lines, each including:
 a first p-type transistor having a first source, a first drain and a first gate;
 a second n-type transistor having a second source, a second drain and a second gate; and
 a third voltage swing reducing element having first and second terminals, said first terminal coupled to said first drain, said second terminal coupled to said second drain and to a respective one of said fourth plurality of complemented bit lines, said first source coupled to a source of supply potential, said second source coupled to a source of ground potential, said first and second gates mutually coupled to form an input of said inverting bit line driver.

5. A content addressable memory as defined claim 4 wherein said voltage swing reducing element comprises:
 an n-type transistor having a further source, a further drain, and a further gate, said further drain coupled to said first terminal, said further source coupled to said second terminal, and said further gate coupled to said source of supply potential.

6. A content addressable memory as defined claim 4 wherein said voltage swing reducing element comprises:
 a p-type transistor having a further source, a further drain, and a further gate, said further source coupled to said first terminal, said further drain coupled to said second terminal, and said further gate coupled to said source of ground potential.

7. A content addressable memory as defined claim 4 wherein said voltage swing reducing element comprises:
 an diode coupled in forward-biased orientation between said first terminal and said second terminal.

8. A content addressable memory integrated circuit device comprising:

a first plurality memory cells;

a second plurality of match lines respectively coupled to said first plurality of memory cells;

a third plurality of un-complemented bit lines respectively coupled to said first plurality of memory cells;

a fourth plurality of complemented bit lines respectively coupled to said first plurality of memory cells;

a first power supply circuit having an input coupled to a first power terminal and adapted to receive therefrom electrical power at a first voltage relative to a reference potential and output electrical power at a second voltage relative to said reference potential, said second voltage lower than said first voltage;

a fifth plurality of non-inverting bit line drivers respectively coupled to said third plurality of bit lines, each non-inverting bit line driver of said fifth plurality having a power input coupled to an output of said first power supply circuit for receiving electrical power at said second voltage;

a sixth plurality of inverting bit line drivers, each inverting bit line driver of said sixth plurality having a power input coupled to an output of said first power supply circuit for receiving electrical power at said second voltage;

a seventh plurality of match line drivers respectively coupled to said second plurality of match lines, each match line driver of said seventh plurality having a power input terminal coupled to said first power terminal for receiving electrical power at said first voltage.

9. A network router comprising:

a computer processor adapted to receive power at power input, said power having a first voltage with respect to a ground potential;

an input port coupled to said processor;

and output port coupled to said processor; and a content addressable memory device coupled to said processor, said content addressable memory including a plurality of bit lines, said bit lines adapted to carry a plurality of electric signals, said plurality of electrical signals having an instantaneous voltage in a range between said ground potential and a second voltage with respect to said ground potential, said second voltage lower than said first voltage.

10. A network router comprising:

a computer processor;

an input port coupled to said processor;

and output port coupled to said processor; and a content addressable memory device coupled to said processor, said content addressable memory including:
 a plurality of bit lines, said bit lines adapted to carry a plurality of electric signals, said plurality of electrical signals having an instantaneous voltage in a first range between a ground potential and a first voltage with respect to said ground potential; and
 a plurality of match lines, said match lines adapted to carry a plurality of electric signals, said plurality of electrical signals having an instantaneous voltage in a second range between said ground potential and a second voltage with respect to said ground potential, said second voltage higher than said first voltage.

11. A communication network comprising:

a network router including:
 a content addressable memory device having a plurality of bit lines, said bit lines adapted to assume respective instantaneous voltages in a range between about 0 V and about 0.9 V, said voltages taken with respect to a common reference potential.

12. A method of operating a content addressable memory, the method comprising:

charging a match line of said content addressable memory to a first voltage, said first voltage measured with respect to a second reference voltage;

applying a logic signal to an input of a bit line driver so that said bit line driver sets a bit line to one of a third or a fourth voltage, said third voltage substantially equal to said second reference voltage, said fourth voltage less than said first voltage;

comparing a logic state of a first bit stored in said content addressable memory with a value of said logic signal; and changing the voltage level of said match line to said second reference potential if said logic state of said first bit is not equal to said value of said logic signal.

* * * * *

UNITED STATES PATENT AND TRADEMARK OFFICE
CERTIFICATE OF CORRECTION

PATENT NO. : 6,819,578 B2
DATED : November 16, 2004
INVENTOR(S) : Zvi Regev

It is certified that error appears in the above-identified patent and that said Letters Patent is hereby corrected as shown below:

Column 9,
Line 14, "portions if" should read -- portions of --.

Column 11,
Lines 28, 35 and 42, "defined claim" should read -- defined in claim --;
Line 44, "an diode" should read -- a diode --; and
Line 48, "plurality memory" should read -- plurality of memory --.

Signed and Sealed this

Twentieth Day of December, 2005

JON W. DUDAS
*Director of the United States Patent and Trademark Office*